(12) United States Patent
Itagaki

(10) Patent No.: US 10,655,577 B2
(45) Date of Patent: May 19, 2020

(54) INTAKE STRUCTURE FOR VEHICLE ENGINE

(71) Applicant: HONDA MOTOR CO., LTD., Tokyo (JP)

(72) Inventor: Keisuke Itagaki, Wako (JP)

(73) Assignee: Honda Motor Co., Ltd., Tokyo (JP)

( * ) Notice: Subject to any disclaimer, the term of this patent is extended or adjusted under 35 U.S.C. 154(b) by 102 days.

(21) Appl. No.: 15/986,343

(22) Filed: May 22, 2018

(65) Prior Publication Data

US 2018/0363602 A1    Dec. 20, 2018

(30) Foreign Application Priority Data

Jun. 14, 2017    (JP) ................................ 2017-116985

(51) Int. Cl.
| | |
|---|---|
| *H01L 23/46* | (2006.01) |
| *H05K 7/20* | (2006.01) |
| *F02M 35/10* | (2006.01) |
| *F02M 35/12* | (2006.01) |
| *H01L 23/467* | (2006.01) |

(52) U.S. Cl.
CPC .. *F02M 35/10268* (2013.01); *F02M 35/1266* (2013.01); *H01L 23/467* (2013.01); *H05K 7/20854* (2013.01); *Y10S 903/905* (2013.01)

(58) Field of Classification Search
CPC ........ F02M 35/10268; F02M 35/1266; H01M 10/66; H01M 10/613; H01M 10/6556; H01M 2/1077; F01P 2050/24; H01L 23/473; H01L 23/467; H05K 7/20854
See application file for complete search history.

(56) References Cited

U.S. PATENT DOCUMENTS

| | | | |
|---|---|---|---|
| 2003/0184973 A1* | 10/2003 | Nagata ................ | B60R 16/0239 361/704 |
| 2011/0308763 A1* | 12/2011 | Charnesky ............ | B60K 11/04 165/41 |
| 2012/0061053 A1 | 3/2012 | Geskes et al. | |
| 2016/0211560 A1* | 7/2016 | Hara ................... | H01M 2/1077 |

FOREIGN PATENT DOCUMENTS

| | | |
|---|---|---|
| JP | H05066218 U | 9/1993 |
| JP | H07052665 A | 2/1995 |
| JP | 2005-120918 A | 5/2005 |
| JP | 2007308000 A | 11/2007 |

(Continued)

OTHER PUBLICATIONS

Office Action issued in Japanese Application No. 2017-116985, dated Aug. 21, 2018.

(Continued)

*Primary Examiner* — Syed O Hasan
(74) *Attorney, Agent, or Firm* — Armstrong Teasdale LLP

(57) ABSTRACT

An intake structure for an internal combustion engine of a vehicle comprises an intake passage member (25) internally defining an intake passage (40) having an air inlet (40A) and an air outlet (40B); and a PCU (14) provided in an engine room of the vehicle and provided with a cooling device for cooling the PCU (14). The intake passage member is provided in proximity of the onboard device for favorable heat transfer between the PCU and the intake passage member.

14 Claims, 6 Drawing Sheets

(56) References Cited

FOREIGN PATENT DOCUMENTS

| | | | |
|---|---|---|---|
| JP | 2008302734 A | 12/2008 |
| JP | 2010-127143 A | 6/2010 |
| JP | 2012-520409 A | 9/2012 |
| JP | 2015113795 A | 6/2015 |
| JP | 2016142214 A | 8/2016 |
| JP | 2017-002735 A | 1/2017 |
| JP | 2017-013680 A | 1/2017 |

OTHER PUBLICATIONS

Notification of Reasons for Refusal for Japanese Application No. 2017-116985, dated Dec. 25, 2018, 3 pages.

* cited by examiner

INTAKE STRUCTURE FOR VEHICLE ENGINE

TECHNICAL FIELD

The present invention relates to an intake structure for an internal combustion engine of a vehicle.

BACKGROUND ART

A vehicle engine may include an air cooler for cooling the intake air of the engine. The air cooler may be either an air-cooled air cooler using the ambient air as a cooling agent or a water-cooled air cooler using cooling water as a cooling agent. See JP2010-127143A and JP2012-520409A.

Typically, such an air cooler is used for the purpose of lowering the temperature of the intake air which is raised owing to the use of a turbocharger for compressing the intake air. Even in the case of a natural aspiration engine, the intake member defining an intake passage and located in the engine room may be warmed by the heat from the engine (in particular, the exhaust system thereof). In such a case, it may be advantageous to provide an air cooler in order to prevent the intake passage from becoming undesirably high in temperature.

If an air-cooled air cooler is used for such a purpose, the air cooler is required to be positioned near the front grill located in a front part of the vehicle so that the fresh air drawn from outside, instead of the warmed air in the engine room, may be made available. However, the front end part of the engine room is already occupied by other devices of the engine in most cases, and does not provide an adequate space required for placing the air cooler. In the case of a water-cooled air cooler, because of the need for the piping for the cooling water and other component parts, the cost may be unacceptably high.

SUMMARY OF THE INVENTION

In view of such problems of the prior art, a primary object of the present invention is to provide an intake structure for an internal combustion engine of a vehicle which can cool the intake air without requiring a direct access to fresh cooling air.

A second object of the present invention is to provide an intake structure for an internal combustion engine of a vehicle which requires a minimum number of additional component parts.

To achieve such an object, the present invention provides an intake structure for an internal combustion engine of a vehicle, comprising: an intake passage member (25) internally defining an intake passage (40) having an air inlet (40A) and an air outlet (40B); and an onboard device (14) provided in an engine room of the vehicle and provided with a cooling device for cooling the onboard device; wherein the intake passage member is provided in proximity of the onboard device.

Owing to the presence of the cooling device for the onboard device, not only the onboard device but also the intake passage member can be cooled by the cooling device. Therefore, the intake air flowing through the intake passage defined in the intake passage member can be cooled without requiring any special cooling device for the intake system. The term "in proximity" as used herein means that the intake passage member is placed close to the onboard device, and may be either spaced from or in contact with the onboard device. At any event, it is necessary that the onboard device and the intake passage member are in a heat exchanging relationship. The onboard device may consist of a power control unit (PCU) or any other device that requires a cooling arrangement for operation.

Preferably, the intake passage member is provided with a substantially small depth as compared to a width and a length thereof, and is provided with an opposing wall (44) opposing the onboard device, the opposing wall being defined by the width and the length of the intake passage member.

Thereby, the heat can be exchanged between the intake passage member and the onboard device over a large area so that the heat transfer between the two parts can be maximized.

Preferably, an outer wall surface of the opposing wall of the intake passage member is spaced from an opposing surface of the onboard device.

Thereby, even when the intake passage member and the onboard device expand and shrink thermally, the resulting relative movement between the two parts is prevented from causing undesired noises and frictions.

Preferably, the outer wall surface of the opposing wall of the intake passage member is substantially planar, and the intake passage defined in the intake passage member is curved in a plane in parallel with the outer wall surface of the opposing wall.

Because of the curving of the intake passage, the heat transfer area for the intake passage can be increased. Also, the noises originating from the engine is prevented from being transmitted linearly through the intake passage so that noise emission from the intake system can be minimized.

According to a preferred embodiment of the present invention, the intake passage member is substantially rectangular in shape, and internally defines a first resonance chamber (56) along the intake passage curves on a concave side of the intake passage, the first resonance chamber opposing the onboard device via the opposing wall of the intake passage member.

Even though the intake passage member is regularly shaped, the curving of the intake passage creates a space on a concave side thereof. This space can be advantageously utilized as the first resonance chamber which is effective in reducing the intake noises. By providing only a single curve to the intake passage, the flow resistance to the intake flow can be minimized.

Preferably, the intake passage member is provided with a bulging portion (48A) bulging out from the intake passage member in a widthwise direction on a convex side of the intake passage facing away from the first resonance chamber.

Thereby, the curving intake passage can be favorably accommodated in the intake passage member without unduly increasing the overall size of the intake passage member.

Preferably, the opposing wall of the intake passage member is provided with a first drooping portion (25D) extending in a depthwise direction along a side of the onboard device, the first drooping portion internally defining a part of the first resonance chamber.

By providing such a first drooping portion, the intake passage member can be positioned on the onboard device in a stable manner so that the assembly process can be facilitated. Also, heat exchange between the intake passage member and the onboard device can be enhanced. Because the first drooping portion internally defines at least a part of the first resonance chamber, the available space can be efficiently utilized.

Preferably, the intake passage member internally defines a second resonance chamber (57) in a part thereof on a downstream side of the bulging portion and on the convex side of the intake passage.

This again allows the available space in the intake passage chamber to be efficiently utilized.

Preferably, the opposing wall of the intake passage member is provided with a second drooping portion (25E) extending in a depthwise direction along a side of the onboard device, the second drooping portion internally defining a part of the second resonance chamber.

By providing such a second drooping portion, heat exchange between the intake passage member and the onboard device can be enhanced. Further, as the second drooping portion internally defines a part of the second resonance chamber, the available space can be efficiently utilized. Also, owing to the presence of the second drooping portion, preferably on a side different from the first drooping portion, the intake passage member can be positioned on the onboard device in an even more stable manner so that the assembly process can be facilitated.

Preferably, a part of the opposing wall of the intake passage member adjoining the air inlet is provided with a third drooping portion (25F) extending in a depthwise direction along a side of the onboard device.

This adds to the advantages offered by the first and second drooping portions. Also, the third drooping portion prevents the relatively hot air in the engine room from entering the gap defined between the outer wall surface of the opposing wall of the intake passage member and the opposing surface of the onboard device so that the cooling efficiency of the intake passage member can be improved.

Preferably, the intake passage member is provided with an attaching portion (65B) extending from the intake passage member for securing the intake passage member to the onboard device, and the attaching portion is provided with a depending piece (68) depending from the attaching portion and extending in a depthwise direction along a side of the onboard device.

The depending piece allows the intake passage member to be placed on the onboard device in a most stable manner preferably in cooperation with the first, second and third drooping portions, particularly when these parts are provided on four sides or otherwise diametrically opposing parts of the intake passage member.

Preferably, the opposing wall of the intake passage member is provided with a through hole (61) communicating an interior of the intake passage with a gap defined between the outer wall surface of the opposing wall of the intake passage member and the opposing surface of the onboard device.

Thereby, the air in the gap cooled by the cooling device for the onboard device is drawn into the intake passage via the through hole so that the intake air can be cooled in a particularly favorable manner.

Typically, the intake passage extends from front to rear in a fore and aft direction so that the air flow created by the movement of the vehicle can be efficiently utilized.

Preferably, the opposing wall is a bottom wall (44) of the intake passage member.

It is particularly advantageous if the vehicle consists of a hybrid vehicle using an electric motor for propulsion, in addition to the internal combustion engine, and the onboard device comprises a PCU (14) for the electric motor.

The present invention thus provides an intake structure for an internal combustion engine of a vehicle that can cool the intake air without requiring a direct access to fresh cooling air, and requires a minimum number of additional component parts.

BRIEF DESCRIPTION OF THE DRAWING(S)

DESCRIPTION OF THE PREFERRED EMBODIMENT(S)

A preferred embodiment of the present invention is described in the following with reference to the appended drawings.

Figure 1:
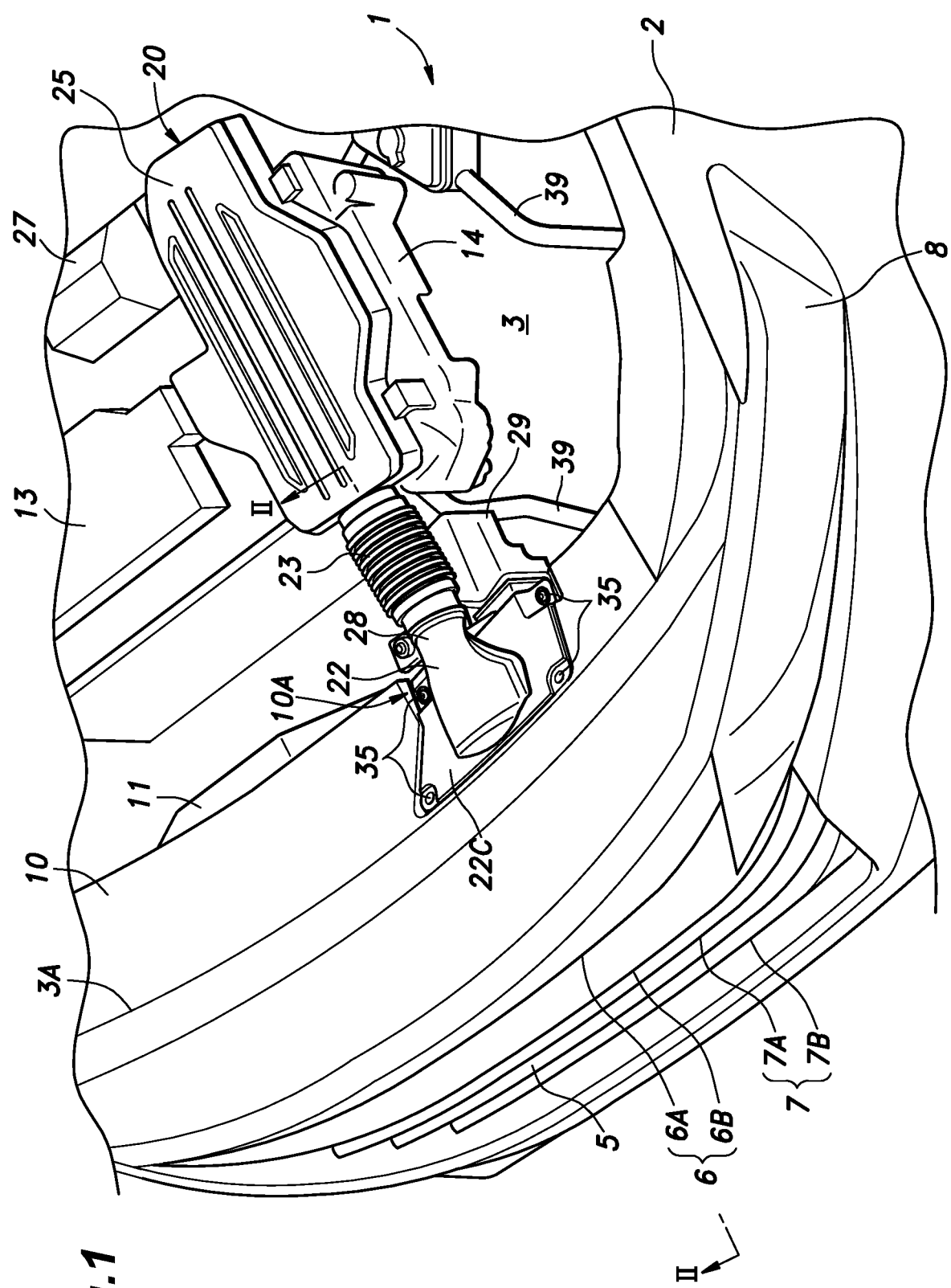
FIG. 1 is a perspective view of a front part of a motor vehicle according to an embodiment of the present invention.

FIG. 1 is a perspective view of a front part of a motor vehicle 1 according to the embodiment of the present invention. As shown in FIG. 1, an engine room 3 is provided at a front end part of a vehicle body 2 of the vehicle 1. An upper opening 3A of the engine room 3 is covered from above by an engine hood 4 (see FIG. 2) provided so as to be open when required. In FIG. 1, the engine hood 4 is opened out of view, and some of the components are omitted from illustration.

Figure 2:
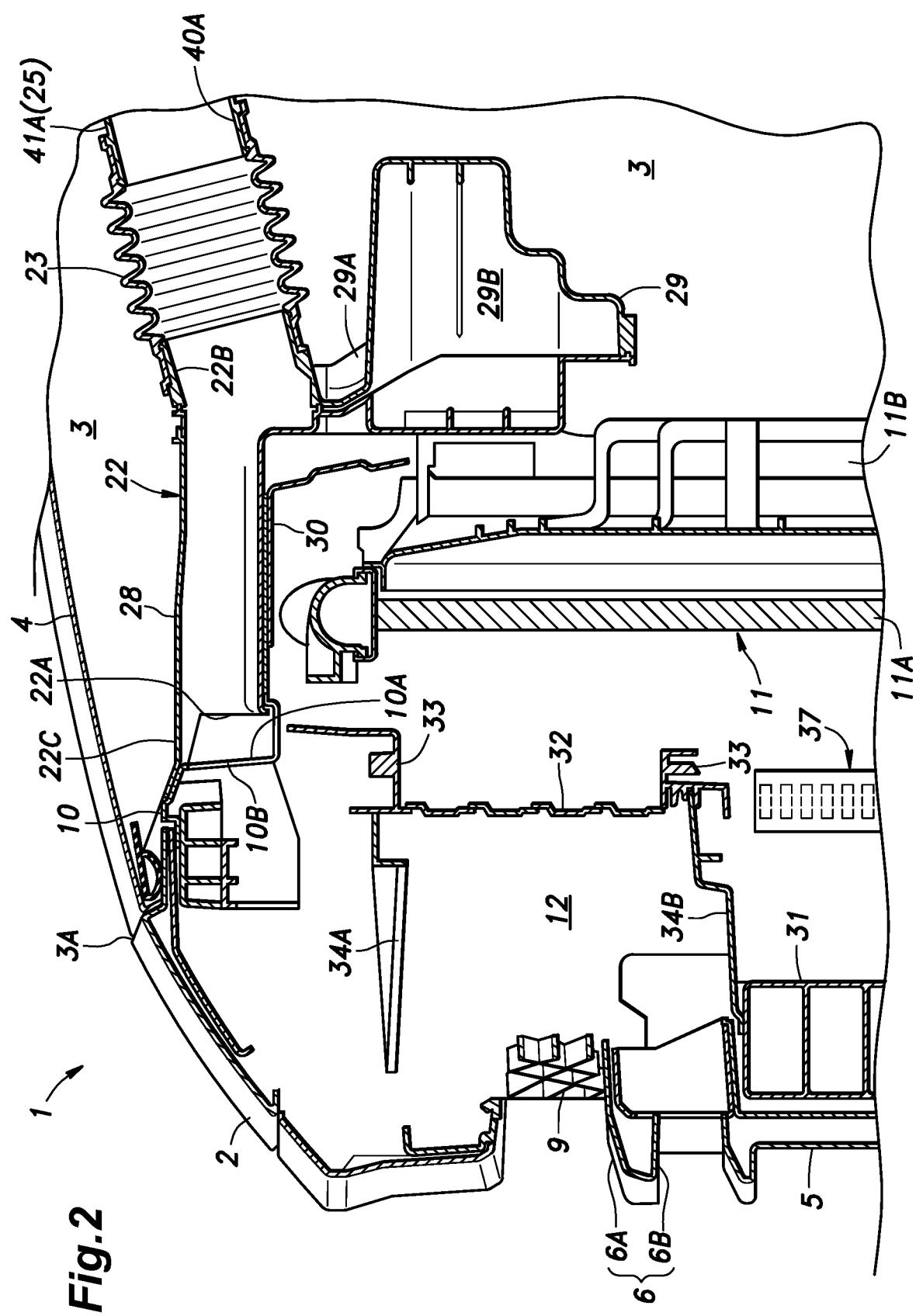
FIG. 2 is a sectional view taken along line II-II of FIG. 1.

As shown in FIG. 2, a front bumper 5 extends laterally on the front end of the vehicle body 2, and an upper vehicle body opening 6 and a lower vehicle body opening 7 each elongated in the lateral direction are formed in the front end of the vehicle body 2. A pair of front lights 8 are provided on either side of the front end of the vehicle body 2. The upper vehicle body opening 6 comprises an upper and a lower opening 6A and 6B, and the lower opening 6B is fitted with a mesh-like front upper grille 9. The lower vehicle body opening 7 also comprises an upper and a lower opening 7A and 7B.

As shown in FIG. 2, a radiator 11 is provided behind the upper vehicle body opening 6, and is supported by a rectangular bulkhead which is in turn fixedly secured to the vehicle body 2 so that a space 12 is defined between the front end of the vehicle body 2 and the radiator 11. A cover member 10 extends between the upper end surface of the bulkhead and the opposing part of the front end of the vehicle body 2. The engine hood 4 covers the cover member 10 as well as the remaining part of the engine room 3.

An engine 13 consisting of an internal combustion engine is mounted laterally in a rear part of the engine room 3. The vehicle 1 consists of a hybrid vehicle using an electric motor (not shown in the drawings) for propulsion, in addition to the internal combustion engine 13, and a power control unit 14 (hereinafter referred to as PCU 14) for controlling the motor is mounted on the upper left side of the engine 13. The PCU 14 has an elongated, substantially rectangular parallelepiped shape, and is fixedly secured to a transmission case (which is integrally connected to the main body of the engine) with the lengthwise direction directed in the fore and aft direction.

The engine 13 is provided with an intake system 20 which includes an upstream side duct module 22 having an air inlet 22A (FIG. 2) and incorporated with an upstream resonator, a bellows pipe 23 having an upstream end connected to the rear end (downstream end) of the upstream side duct module 22, and a downstream side duct module 25 having an upstream end connected to the rear end (downstream end) of the bellows pipe 23 and incorporated with downstream resonators (as will be described hereinafter). The upstream side duct module 22 is attached to a part of the cover member 10 located on the left hand side thereof.

The downstream side duct module 25 (intake passage member) is elongated in the fore and aft direction, and has a small vertical dimension as compared to the width thereof. The downstream side duct module 25 is placed on the PCU 14 in a substantially overlapping relationship in plan view, and extends in the fore and aft direction along the left side of the engine 13. The downstream end of the downstream side duct module 25 is connected to an air cleaner 27 located behind the engine 13. The downstream end of the air cleaner 27 is connected to an intake manifold of the engine 13 not shown in the drawings.

To the rear end of the downstream side duct module 25, an intake hose 26 (see FIG. 4) extending obliquely downward and rightward toward the rear and curving to the right is connected. An air cleaner 27 is disposed behind the engine 13 and to the right of the downstream side duct module 25, and the downstream end of the air intake hose 26 is connected to the air cleaner 27. The downstream end of the intake system 20 is formed by an intake manifold attached to the rear surface of the engine 13 and communicating with the downstream end of the air cleaner 27.

FIG. 2 is a sectional view taken along line II-II of FIG. 1. The upstream side duct module 22 consists of a passage portion 28 defining an intake passage extending in the fore and aft direction, and a resonator portion 29 (upstream resonator) depending from a rear part of the passage portion 28. The passage portion 28 defines a substantially circular cross section in the rear part thereof. This passage increases in the lateral width thereof toward the upstream end thereof, and is provided with a generally small vertical dimension in a front part thereof. The upstream end of the passage portion 28 defines the air inlet 22A, and the downstream end thereof is provided with a tubular connecting portion 22B connected to the upstream end of the bellows pipe 23. The passage portion 28 is further provided with a flange 22C which extends laterally from either side of the passage portion 28. The flange 22C is provided with a rectangular outer profile. The resonator portion 29 includes a neck portion 29A directly communicating with the internal bore of the passage portion 28, and a resonance chamber 29B communicating with the internal bore of the passage portion 28 via the neck portion 29A.

A rear end of the cover member 10 is supported by an upper cross member 30 of the front bulkhead having a rectangular configuration and supporting a radiator 11. The upper cross member 30 is formed as a sheet metal member having an L-shaped cross section. In the illustrated embodiment, the upper cross member 30 is formed by joining a pair of sheet metal strips so as to form a horizontal upper wall and a vertical wall depending from the rear end of the upper wall.

The radiator 11 includes a radiator core 11A having a major plane facing in the fore and aft direction, a shroud 11B covering the rear side of the radiator core 11A and centrally defining an air outlet, and a radiator fan mounted on a part of the rear side of the radiator core 11A corresponding to the air outlet. The shroud 11B protrudes rearward from the front bulkhead (upper cross member 30). The radiator 11 is positioned in a laterally central part of the engine room 3, and is supported by the upper cross member 30 and a lower cross member (not shown in the drawings) of the front bulkhead. The resonator portion 29 of the upstream side duct module 22 is positioned opposite to a part of the back side of the shroud 11B located to the left of the air outlet. The radiator 11 is connected to the engine 13 via cooling water piping so as to cool the cooling water circulating in the water jacket of the engine 13.

The front bumper 5 is supported by a bumper beam 31 that extends laterally and is fixedly attached to the vehicle body frame (not shown in the drawings) via extensions thereof (not shown in the drawings). An active grill shutter 32 is provided between the upper vehicle body opening 6 and the radiator 11. The active grill shutter 32 is supported by a rectangular frame member 33 which is in turn fixedly secured to the upper cross member 30 via an upper end part of the frame member 33. An upper flow guide plate 34A extends forward from an upper part of the frame member 33, and a lower flow guide plate 34B extends forward from a lower part of the frame member 33. The front end of the lower flow guide plate 34B is supported by the upper surface of the bumper beam 31. The upper flow guide plate 34A and the lower flow guide plate 34B jointly define an air passage for conducting the external air admitted from the upper vehicle body opening 6 through the active grill shutter 32.

A PCU radiator 37 for cooling the PCU 14 is provided under the active grill shutter 32. The PCU radiator 37 is located ahead of the radiator 11 so that the external air admitted from the lower vehicle body opening 7 (FIG. 1) is directed toward the PCU radiator 37.

As shown in FIG. 1 also, a left hand side part of the upper surface of the cover member 10 is formed with a recess 10A which opens out toward the rear, and a lower half part of the upstream side duct module 22 is received in this recess 10A while an upper half part of the upstream side duct module 22 protrudes above the general upper surface of the cover member 10. A plurality of longitudinal slots arranged laterally at a regular interval extend in a front wall and a front part of a bottom wall of the recess 10A to define an opening 10B of the recess 10A. The lateral flange 22C of the upstream side duct module 22 overlies a part of the cover member 10 adjoining the recess 10A. The upstream side duct module 22 is fixedly attached to the cover member 10 by using clips 35 which are passed into openings formed in the four corners of the flange 22C, and into corresponding openings in the cover member 10 and the upper cross member 30.

As shown in FIG. 2, the air inlet 22A is spaced from the front wall of the recess 10A by a certain distance. The upstream side duct module 22 is elongated in the fore and aft direction, and a front end part thereof overhangs from the front edge of the upper cross member 30 so that the air located well ahead of the upper cross member 30 and the radiator 11 is drawn into the air inlet 22A via the opening 10B. The bellows pipe 23 extends rearward with a certain upward slant from the tubular connecting portion 22B of the upstream side duct module 22.

Figure 3:
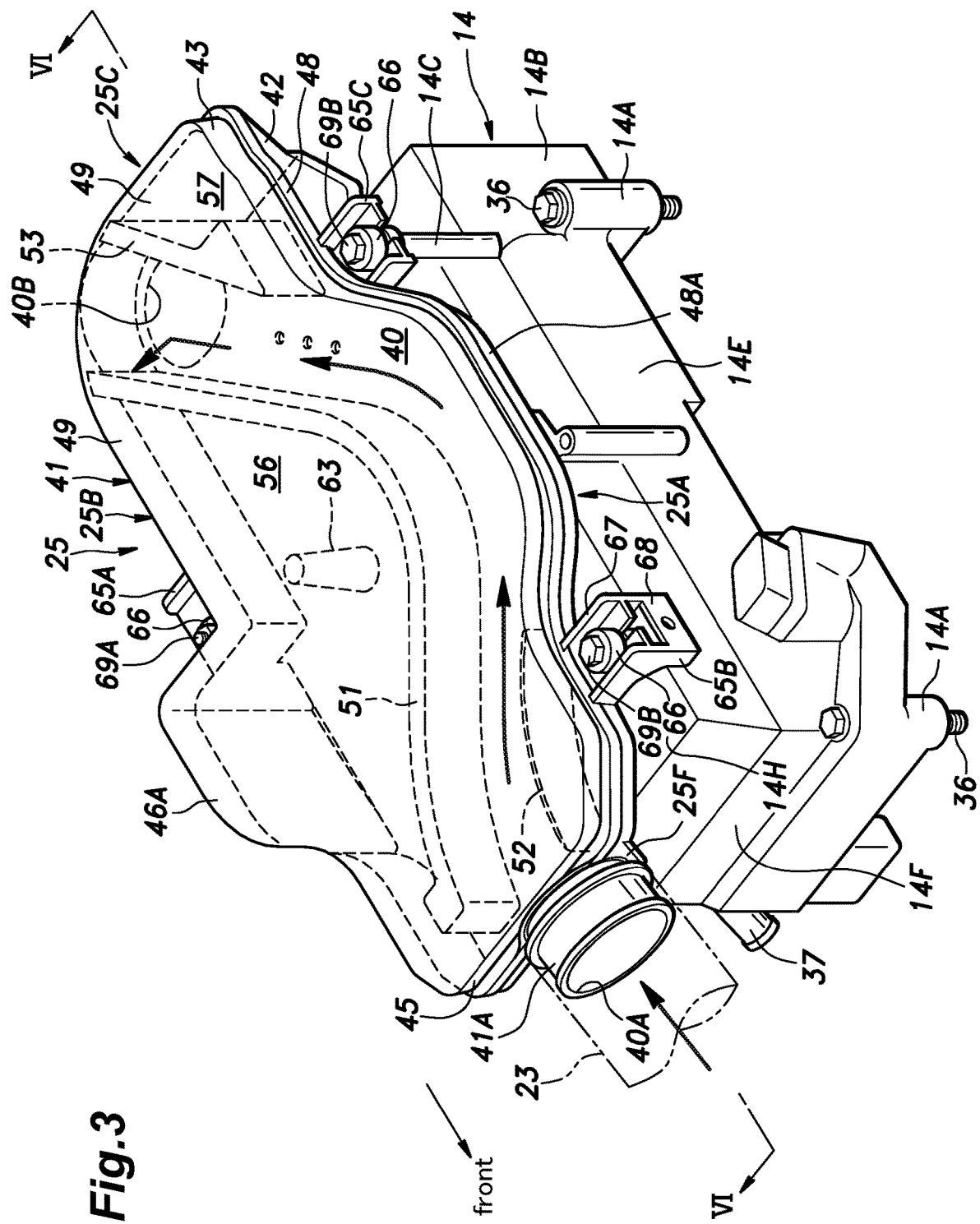
FIG. 3 is an enlarged perspective view of a part surrounding a downstream side duct module shown in FIG. 1.
Figure 4:
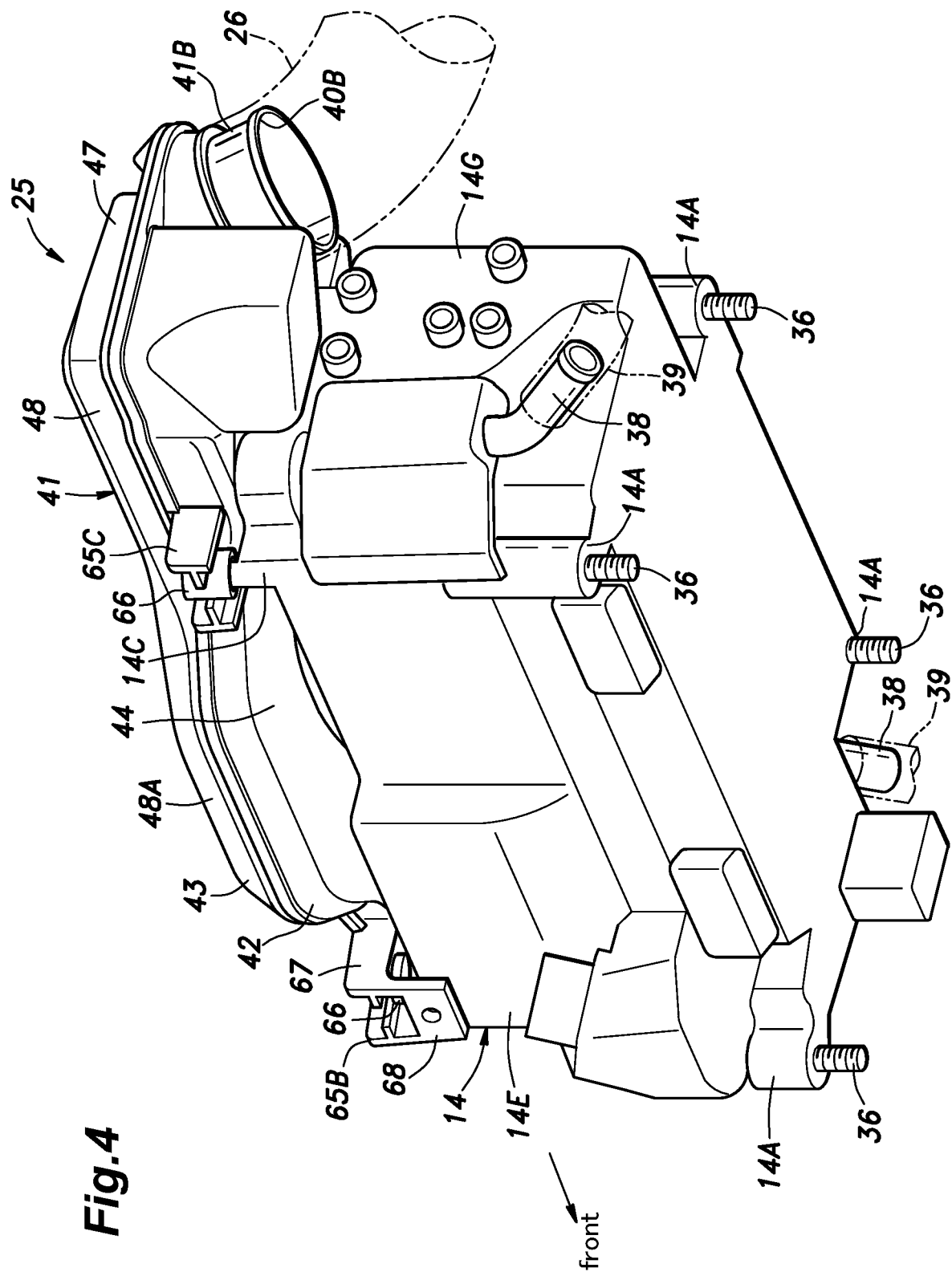
FIG. 4 is a perspective view of the part surrounding the downstream side duct module as viewed from below.

FIG. 3 is an enlarged perspective view of a part surrounding the downstream side duct module shown in FIG. 1, and FIG. 4 is a perspective view of the part surrounding the downstream side duct module. The PCU 14 is provided with a casing 14B formed with four vertically extending holes in four corners thereof, and four fastening bolts 36 are passed through these holes to fixedly secure the PCU 14 to the casing of a transmission device of the vehicle not shown in the drawings.

The PCU 14 is internally provided with various pieces of electric equipment such as a converter and an inverter which emit heat during operation. Therefore, the PCU 14 is required to be cooled. For this purpose, the casing 14B of the PCU 14 is formed with a water jacket not shown in the drawings. A pair of connecting tubes 38 extend from a front end part and a rear end part thereof, respectively, which serve as an inlet and an outlet, respectively, for the cooling water in the water jacket. The cooling water in the water jacket exchanges heat with the casing 14B of the PCU 14 to remove the heat emitted from the PCU 14.

The connecting tubes 38 of the PCU 14 are connected to the PCU radiator 37 (FIG. 2) via a PCU cooling water piping 39 so that the cooling water warmed by the PCU 14 is cooled in the PCU radiator 37. This is only an example of the cooling device for the PCU 14, and other forms of cooling devices can also be used for cooling the PCU 14 without departing from the scope of the present invention.

The downstream end of the bellows pipe 23 is connected to the downstream side duct module 25 which internally defines an intake passage 40 for forwarding the air supplied from the air inlet 22A of the upstream side duct module 22 to the engine 13. The downstream side duct module 25 is provided with a rectangular main body 41 that has a small vertical dimension, and is elongated in the fore and aft direction. In particular, the downstream side duct module 25 or the main body 41 thereof is provided with a low profile by having a substantially small depth as compared to a width and a length thereof. The front end of the main body 41 is integrally provided with a tubular upstream side connecting portion 41A projecting forward and internally defining an air inlet 40A of the intake passage 40. The rear end of the main body 41 is integrally formed with a tubular downstream side connecting portion 41B extending downward and internally defining an intake air outlet 40B of the intake passage 40, and connected to the air cleaner 27 via the intake hose 26.

The main body 41 includes a lower half 42 consisting of a shell member having an upwardly facing concave side and an upper half 43 consisting of a shell member having a downwardly facing concave side so that the lower half 42 and the upper half 43 jointly form a rectangular hollow shell. The lower half 42 and the upper half 43 may be each formed as an injection molded member made of relatively hard plastic material such as PP (polypropylene), and may be joined to each other by any suitable method such as vibration welding.

The upstream side connecting portion 41A is integrally formed in the lower half 42, and the air inlet 40A defined therein faces forward. The upstream side connecting portion 41A is connected to the downstream end or the rear end of the bellows pipe 23 (FIG. 3). The downstream side connecting portion 41B is also integrally formed in the lower half 42, and the air outlet 40B defined therein faces obliquely in a rightward and downward direction. The upstream end of the intake hose 26 is connected to the air outlet 40B.

Figure 5:
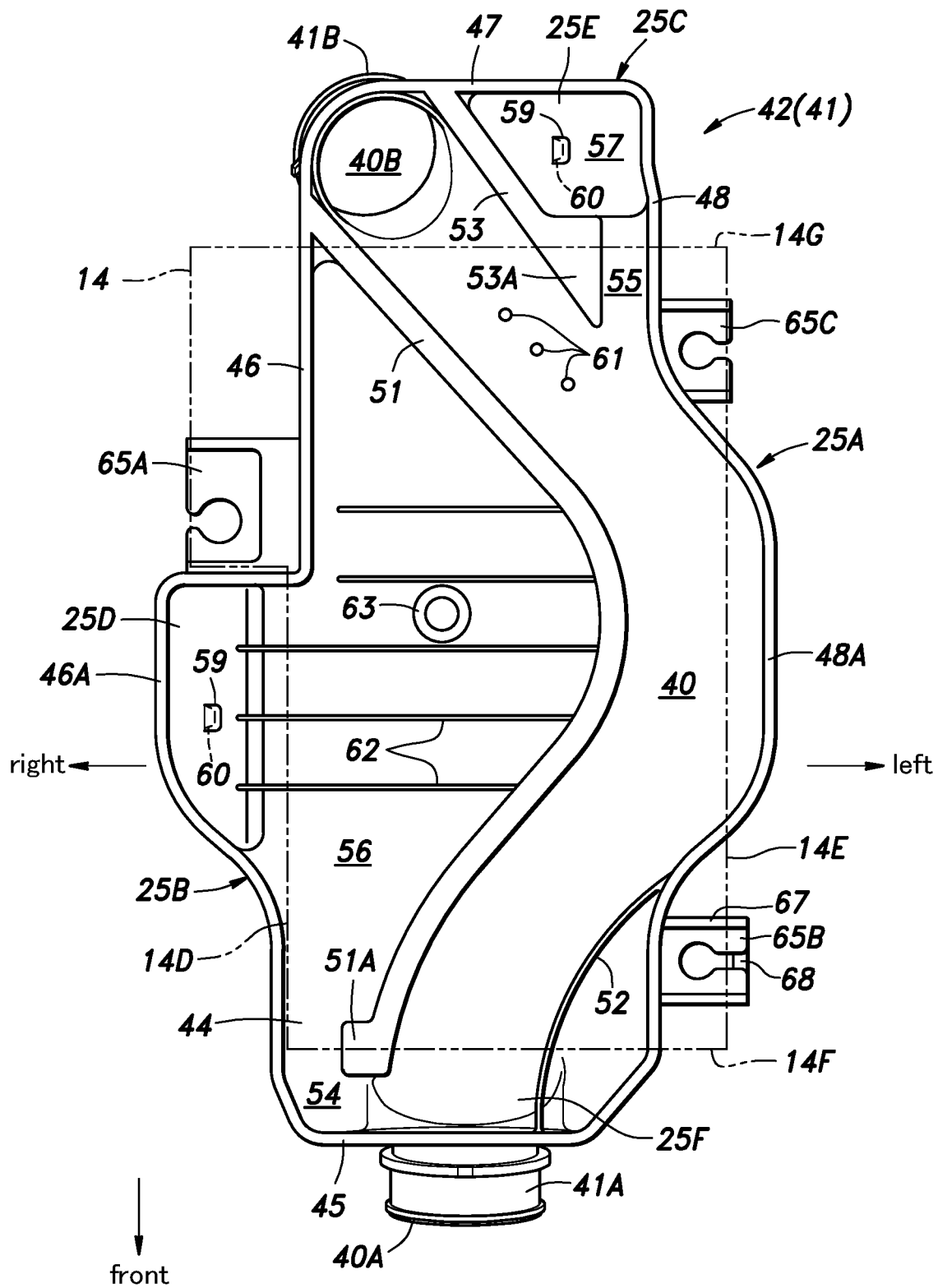
FIG. 5 is a plan view of a lower half of the downstream side duct module.

FIG. 5 is a plan view of the lower half 42 of the downstream side duct module 25 in which the PCU 14 is shown in imaginary lines. As shown in FIGS. 3 to 5, the main body 41 includes a bottom wall 44, side walls (consisting of a front wall 45, a right wall 46, a left wall 48 and a rear wall 47) extending upward from the periphery of the bottom wall 44 in a continuous manner, and a top wall 49 closing the top end of the main body 41. The bottom wall 44 is generally planar, has a uniform thickness, and opposes the PCU 14. The main body 41 has a substantially larger fore and aft dimension than the PCU 14 so as to extend beyond the front edge and the rear edge of the PCU 14 in both the front and rearward directions. The main body 41 has a lateral dimension substantially equal to that of the PCU 14, but includes parts that extend beyond the lateral edges of the PCU 14 and parts that are confined within the lateral edges of the PCU 14 in plan view.

An intermediate part of the right wall 46 (with respect to the fore and aft direction) of the main body 41 includes a protrusion 46A which protrudes rightward from the generally linear remaining part of the right wall 46 beyond the right side surface 14D of the PCU 14 in plan view, and is connected to the remaining part of the right wall 46 via a curved wall section at the rear end thereof and along a perpendicular wall section at the front end thereof. An intermediate part of the left wall 48 (with respect to the fore and aft direction) of the main body 41 includes a bulging portion 48A which bulges leftward from the generally linear remaining part of the left wall 48 beyond the left side surface 14E of the PCU 14 in plan view. The front wall 45 which is positioned some distance ahead of the front side surface 14F of the PCU 14 is (laterally) centrally provided with the air inlet 40A. Therefore, the air inlet 40A is located some distance ahead of the front side surface 14F of the PCU 14. The rear wall 47 of the main body 41 is located some distance behind the rear side surface 14G of the PCU 14. The air outlet 40B is formed in a part of the bottom wall 44 located in a rear and right corner thereof which is some distance behind the rear side surface 14G of the PCU 14.

The intake passage 40 communicating the air inlet 40A with the air outlet 40B is defined in the main body 41 by the top wall 49, the bottom wall 44, a right upright partition wall 51 extending along a curved path, a first left upright partition wall 52 extending from the air inlet 40A to a front part of the bulging portion 48A of the left wall 48 in parallel with the right upright partition wall 51, the bulging portion 48A, and a second left upright partition wall 53 extending from the bulging portion 48A to the air outlet 40B in parallel with the right upright partition wall 51. Thus, the intake passage 40 extends from the air inlet 40A along a rightward oblique path toward the bulging portion 48A and then curves leftward toward the air outlet 40B in plan view, and is provided with a substantially constant lateral width (cross sectional area) over the entire length thereof. In particular, the intake passage 40 curves leftward in a plane in parallel with the bottom wall 44.

The right upright partition wall 51 and the second left upright partition wall 53 have a substantially larger thickness than the first left upright partition wall 52 (and than the surrounding walls of the main body 41), and the upper ends thereof are welded to the top wall 49 of the upper half 43, for instance, by vibration welding. The upper end of the first left upright partition wall 52 is spaced from the top wall 49 of the upper half 43.

The rear ends of the right upright partition wall 51 and the second left upright partition wall 53 are connected to the right wall 46 and the rear wall 47, respectively, and the front end of the first left upright partition wall 52 is connected to the front wall 45. However, the front end 51A of the right upright partition wall 51 is spaced from the front wall 45, and is also spaced from the right wall 46 so as to define a narrowed first neck portion 54 leading to a first resonance chamber 56 (which will be described hereinafter). The terminal end of the front end 51A is provided with a locally increased wall thickness so as to define a substantially rectangular cross section.

The rear end of the first left upright partition wall 52 is smoothly connected to a part of the left wall 48 corresponding to a base portion of the bulging portion 48A.

The second left upright partition wall 53 extends linearly in an oblique direction toward the bulging portion 48A, and the front end 53A thereof is spaced from the left wall 48 so as to define a narrowed second neck portion 55 leading to a second resonance chamber 57 (which will be described hereinafter). The terminal end of the front end 53A is provided with a locally increased wall thickness so as to define a substantially triangular cross section. The inner surface of the second left upright partition wall 53 defining the intake passage 40 extends along a path that is an extension of the inner surface of a part of the left wall 48 corresponding to the rear base portion of the bulging portion 48A.

The intake passage 40 thus extends from the air inlet 40A to the air outlet 40B along a laterally curved path. In particular, the intake passage 40 curves toward the left or away from the engine 13 in an intermediate part thereof. Thus, the intake air flows through the intake passage 40 along this curved path extending in a plane in parallel with the bottom wall 44, and exits the air outlet 40B in a downward and rightward direction. The intake air is then forwarded to the air cleaner 27 positioned behind the engine 13. As shown in FIG. 5, the air inlet 40A is positioned in front of the front side surface 14F of the PCU 14, and the air outlet 40B is positioned behind the rear side surface 14G of the PCU 14. In particular, the intake passage 40 substantially overlaps with the PCU 14 over the entire length thereof in plan view.

As shown in FIGS. 3 and 5, the first resonance chamber 56 is defined between the right upright partition wall 51 and the right wall 46 on a concave side of the curved intake passage 40. The part of the bottom wall 44 corresponding to the protrusion 46A is formed with a first drooping portion 25D by recessing the bottom wall 44 downward, but the remaining part of the bottom wall 44 is generally planar and horizontal. The first resonance chamber 56 communicates with a front end part of the intake passage 40 via the first neck portion 54. The first resonance chamber 56 generally overlaps with the PCU 14 in plan view except for the recessed part of the bottom wall 44 defining the first drooping portion 25D which overhangs from the right side edge of the PCU 14, and depends to a certain extent along the right side surface 14D of the PCU 14 in a spaced apart relationship. The first resonance chamber 56 is defined between the right wall 46 including the protrusion 46A and the concave side of the right upright partition wall 51 which is significantly displaced toward the left side owing to the presence of the bulging portion 48A so that the volume of the first resonance chamber 56 can be maximized.

The second resonance chamber 57 is defined by the second left upright partition wall 53, the left wall 48 and the rear wall 47, and is located behind the rear side surface 14G of the PCU 14 in plan view. The part of the bottom wall 44 corresponding to the second resonance chamber 57 is generally recessed downward so as to define a second drooping portion 25E that is recessed downward. The second resonance chamber 57 communicates with a rear part of the intake passage 40 via the second neck portion 55, and has a smaller volume than the first resonance chamber 56. The bottom wall 44 corresponding to the second resonance chamber 57 or the second drooping portion 25E overhangs from the rear side edge of the PCU 14, and depends to a certain extent along the rear side surface 14G of the PCU 14 in a spaced apart relationship.

The downstream side duct module 25 is thus provided with a passage portion 25A defining the intake passage 40, a first resonator portion 25B defining the first resonance chamber 56 and a second resonator portion 25C defining the second resonance chamber 57.

The bottom wall 44 of the first drooping portion 25D is formed with a through hole 60 communicating the interior of the first drooping portion 24D to the outside, and a cover piece 59 extending from the adjoining part of the bottom wall 44 covers the upper open end of the through hole 60 from above. The bottom wall 44 of the second drooping portion 25E is also provided with a through hole 60 and a cover piece 59 in a similar manner. These through holes are useful for removing any moisture that may be deposited in the first drooping portion 25D and the second drooping portion 25E. A part of the bottom wall 44 corresponding to a downstream part of the intake passage 40 is formed with three through holes 61 arranged centrally in a single file at a regular interval. The part of the bottom wall 44 located in the first resonator portion 25B is formed with a plurality of lower ribs 62 projecting upward and extending laterally, and a support column 63 in a central part thereof for supporting the upper half 43.

Figure 6:
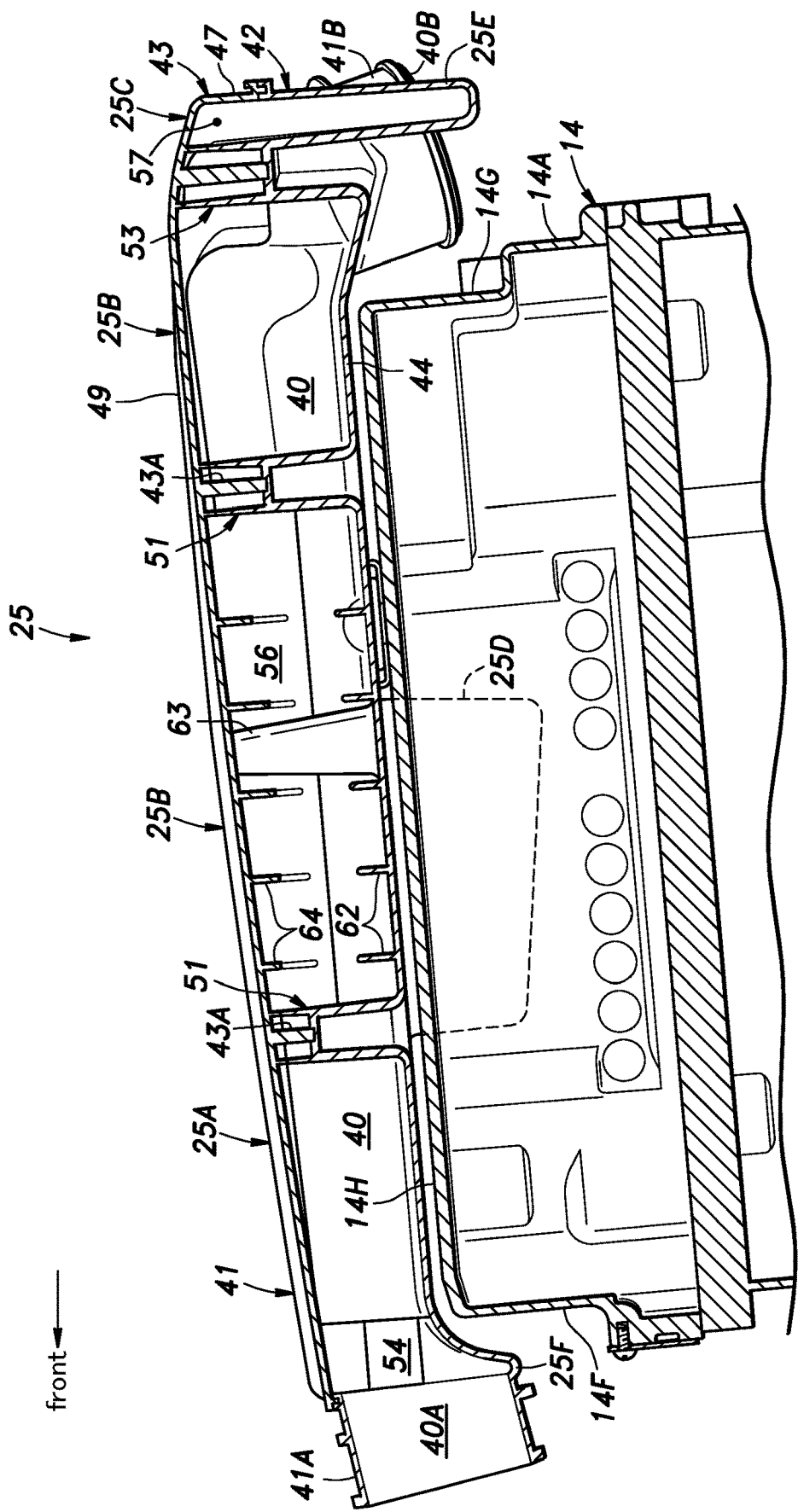
FIG. 6 is a sectional view taken along line VI-VI of FIG. 3.

FIG. 6 is a sectional view taken along line VI-VI of FIG. 3. As shown in FIGS. 3 and 6, a part of the upper half 43 corresponding to the upstream side connecting portion 41A is recessed upward so as to abut the upper side of the upstream side connecting portion 41A in a complementary manner. As best shown in FIG. 6, the part (a third drooping portion 25F) of the bottom wall 44 adjoining the upstream side connecting portion 41A overhangs from the front edge of the PCU 14, and is bent downward in such a manner that the upstream side connecting portion 41A overlaps with the front side surface 14F of the PCU 14 in front view. Thus, the third drooping portion 25F and the second drooping portion 25E oppose the front side surface 14F and the rear side surface 14G of the PCU 14, respectively, and the first drooping portion 25D opposes the right side surface 14D.

As shown in FIG. 6, ribs 43A integrally depend from the parts of the lower surface of the upper half 43 corresponding to the first left upright partition wall 52 and the second left upright partition wall 53, respectively. These ribs 43A are welded to each other, for instance, by vibration welding when joining the upper half 43 and the lower half 42 to each other. A plurality of upper ribs 64 integrally depend downward from the lower surface of the top wall 49 and extend laterally so as to oppose the corresponding lower ribs 62 with a certain gap in each case.

As shown in FIGS. 3 to 5, the outer periphery of the lower half 42 is formed with first to third attaching portions 65A to 65C. The first attaching portion 65A is positioned on a part of the right wall 46 immediately behind the protrusion 46A, and the second and third attaching portions 65B and 65C are positioned on parts of the left wall 48 immediately ahead of and behind the bulging portion 48A, respectively.

The first attaching portion 65A extends rightward, and is provided with a cutout into which a rubber bush 66 is fitted. A stud bolt projects upward from the casing of the PCU 14, and is passed into a central hole of the rubber bush 66. A nut 69A threaded onto the stud bolt fastens the first attaching portion 65A to the PCU 14.

The second attaching portion 65B extends leftward, and is provided with a cutout into which a rubber bush 66 is fitted, and, in addition, a depending piece 68 depending from the free end of the second attaching portion 65B and extends along the left side surface 14E of the PCU 14. The depending piece 68 may either oppose with a certain gap or be brought into contact with the left side surface 14E of the PCU 14. A threaded bolt 69B is passed into a central hole of the rubber bush 66, and is threaded into a threaded hole formed in the casing of the PCU 14 to fasten the second attaching portion 65B to the PCU 14.

The third attaching portion 65C also extends leftward, and is provided with a cutout into which a rubber bush 66 is fitted. A threaded bolt 69B is passed into a central hole of the rubber bush 66, and is threaded into a threaded hole formed in the casing of the PCU 14 to fasten the third attaching portion 65C to the PCU 14.

In the fully assembled state, the first drooping portion 25D, the second drooping portion 25E, the third drooping portion 25F and the depending piece 68 abut (in contact with) or oppose (with a certain gap) the front side surface 14F, the rear side surface 14G, the right side surface 14D and the left side surface 14E of the PCU 14, respectively. The downstream side duct module 25 can be positioned on the PCU 14 in a stable manner so that the assembly process can be facilitated.

As shown in FIG. 6, in the assembled state, the downstream side duct module 25 (including the upper surface of the bottom wall 44) slightly slants upward toward the rear end thereof. Also, a gap is created between the lower surface of the downstream side duct module 25 and the upper surface 14H of the PCU 14. This gap is desired to be as small as possible.

The mode of operation of the intake system of the engine 13 discussed above is described in the following.

Since the air inlet 22A of the intake system 20 is located ahead of the radiator 11 as shown in FIGS. 1 and 2, the external air admitted through the upper vehicle body opening 6 and having a relatively low temperature is supplied to the engine 13 so that an efficient operation of the engine 13 is ensured. The engine radiator 11 and the PCU radiator 37 allow the excess heat of the engine 13 and the PCU 14, respectively, to be removed.

The air in the engine room 3 is high in temperature owing to the heat emitted from the engine radiator 11 and the PCU radiator 37 as well as from the exhaust system of the engine 13. Therefore, the downstream side duct module 25 which is placed on or adjacent to the engine 13 is inevitably exposed to the high temperature of the engine room 3. As a result, the intake air may be undesirably heated as the intake air flows through the downstream side duct module 25.

According to the present invention, the downstream side duct module 25 is positioned adjacent to the PCU 14 in a heat exchanging relationship. The PCU 14 emits heat during operation, but is provided with a cooling device (consisting of a liquid cooled cooling device in the present embodiment) to control an undesired increase in the temperature of the PCU 14. Therefore, the cooling device for the PCU 14 is used for cooling the downstream side duct module 25 as well as the PCU 14. Because the gap between the downstream side duct module 25 and the PCU 14 is small, it is difficult for the air heated by the heat emitting components of the engine 13 to enter the gap, and the air present in the gap is cooled by the PCU 14. This suppresses increase in the temperature of the intake air, without requiring additional component parts.

The downstream side duct module 25 may be placed in direct contact with the PCU 14 so as to maximize heat transfer between the two parts. However, as the two parts may undergo thermal expansions in different ways during operation, the resulting relative movement between the two parts may create undesired noises. To overcome this problem, in the foregoing embodiment, the two parts are slightly spaced from each other, and are attached to each other at the discrete locations thereof (three locations in the illustrated embodiment) via the attaching portions 65A to 65C which are deformable to a certain extent.

In the foregoing embodiment, the downstream side duct module 25 is located on top of the PCU 14, and the intake passage 40 extends along a curved path from the air inlet 40A to the intake air outlet 40B so that the effective length of the intake passage 40 may be increased. As a result, the heat exchange between the intake air in the intake passage 40 and the PCU 14 can be maximized. The increase in the effective length of the intake passage 40 contributes to the reduction of engine noise emission from the air inlet 40A.

As shown in FIG. 4, the PCU 14 is provided with a substantially rectangular shape, and the first resonator portion 25B of the downstream side duct module 25 substantially entirely overlaps with the PCU 14 in plan view. Since the heat can be favorably transferred from the first resonator portion 25B to the PCU 14, the intake air in the first resonator portion 25B is prevented from rising in temperature. Furthermore, the first resonator portion 25B is formed on the concave side of the curving intake passage 40 so that the first resonator portion 25B can be provided in a space efficient manner.

Since the first resonator portion 25B is defined in the space created by the bent part of the intake passage in the downstream side duct module 25, the first resonator portion 25B can be formed integrally in the downstream side duct module 25 without significantly laterally extending beyond the lateral edges of the PCU 14 in plan view.

As shown in FIGS. 1 and 3, the downstream side duct module 25 is elongated in the fore and aft direction, and the intake passage 40 extends from the front end to the rear end of the downstream side duct module 25 while bending in the lateral direction in the intermediate part thereof. Therefore, the intake air is allowed to flow through the intake passage 40 in the downstream side duct module 25 in a smooth manner with a minimum flow resistance.

Since the first drooping portion 25D, the second drooping portion 25E, the third drooping portion 25F and the depending piece 68 of the downstream side duct module 25 abut or otherwise oppose the four sides of the PCU 14, the downstream side duct module 25 can be properly positioned with respect to the PCU 14 in an effortless manner. Therefore, the downstream side duct module 25 can be secured to the PCU 14 in a stable manner, and can be assembled to the PCU 14 both correctly and with ease. Furthermore, the first drooping portion 25D, the second drooping portion 25E, the third drooping portion 25F and the depending piece 68 of the downstream side duct module 25 contributed to a favorable heat transfer between the PCU 14 and the downstream side duct module 25.

As best shown in FIG. 6, since the third drooping portion 25F overhangs from the front edge of the PCU 14, and extends downwards so as to oppose the front side surface 14F of the PCU 14, the warm air in the engine room 3 is prevented from flowing into the gap between the downstream side duct module 25 and the PCU 14 from the front end thereof. This further minimizes the rise in temperature of the intake air flowing through the intake passage 40 in the downstream side duct module 25.

The downstream part of the bottom wall 44 is provided with the through holes 61 communicating the interior of the intake passage 40 with the outside (the gap between the downstream side duct module 25 and the PCU 14). These through holes 61 not only allow moisture that may be deposited in the intake passage 40 to be drained but also allow external air to be drawn into the intake passage 40 owing to the negative pressure that is present in the intake passage 40. In particular, because the external air is drawn from the gap between the downstream side duct module 25 and the PCU 14, relatively cool air cooled by the cooling device for the PCU 14 is drawn into the intake passage 40 so that the efficiency of the engine 13 can be maintained. To enhance this effect, the through holes 61 are preferably located in a laterally central part of the gap between the downstream side duct module 25 and the PCU 14.

Although the present invention has been described in terms of a specific embodiment, the present invention is not limited by the illustrated embodiment, but various parts of the present invention may be modified or substituted without departing from the scope of the present invention. For instance, the present invention may also be applied to other types of vehicles such as railway cars and aircraft, instead of a road vehicle. The downstream side duct module 25 was positioned adjacent to the PCU 14 in the foregoing embodiment, but may also be positioned adjacent to any other onboard device provided with a cooling device. Also, the downstream side duct module 25 was positioned on top the PCU 14 in the foregoing embodiment, but may also be positioned next to each other laterally, in the fore and aft direction or in any other desired direction.

The invention claimed is:

1. An intake structure for an internal combustion engine of a vehicle, comprising:
   an intake passage member internally defining an intake passage having an air inlet and an air outlet; and
   an onboard device provided in an engine room of the vehicle and provided with a cooling device for cooling the onboard device;
   wherein the intake passage member is provided in proximity of the onboard device and has an opposing wall opposing the onboard device;
   the opposing wall of the intake passage has a substantially planar outer wall surface; and
   the intake passage defined in the intake passage member is curved in a plane in parallel with the outer wall surface of the opposing wall and substantially overlaps with the onboard device over an entire length thereof as viewed in a direction perpendicular to the plane in parallel with the outer wall surface of the opposing wall.

2. The intake structure according to claim 1, wherein the intake passage member is provided with a substantially small depth as compared to a width and a length thereof, the opposing wall being defined by the width and the length of the intake passage member.

3. The intake structure according to claim 2, wherein the outer wall surface of the opposing wall of the intake passage member is spaced from an opposing surface of the onboard device.

4. The intake structure according to claim 1, wherein the intake passage member is substantially rectangular in shape, and internally defines a first resonance chamber along the intake passage on a concave side of the intake passage, the first resonance chamber opposing the onboard device via the opposing wall of the intake passage member.

5. The intake structure according to claim 4, wherein the intake passage member is provided with a bulging portion bulging out from the intake passage member in a widthwise direction on a convex side of the intake passage facing away from the first resonance chamber.

6. The intake structure according to claim 4, wherein the opposing wall of the intake passage member is provided with a first drooping portion extending in a depthwise direction along a side of the onboard device, the first drooping portion internally defining a part of the first resonance chamber.

7. The intake structure according to claim 5, wherein the intake passage member internally defines a second resonance chamber in a part thereof on a downstream side of the bulging portion and on the convex side of the intake passage.

8. The intake structure according to claim 7, wherein the opposing wall of the intake passage member is provided with a second drooping portion extending in a depthwise direction along a side of the onboard device, the second drooping portion internally defining a part of the second resonance chamber.

9. The intake structure according to claim 4, wherein a part of the opposing wall of the intake passage member adjoining the air inlet is provided with a drooping portion extending in a depthwise direction along a side of the onboard device.

10. The intake structure according to claim 4, wherein the intake passage member is provided with an attaching portion extending from the intake passage member for securing the intake passage member to the onboard device, and the attaching portion is provided with a depending piece depending from the attaching portion and extending in a depthwise direction along a side of the onboard device.

11. The intake structure according to claim 4, wherein the opposing wall of the intake passage member is provided with a through hole communicating an interior of the intake passage with a gap defined between the outer wall surface of the opposing wall of the intake passage member and the opposing surface of the onboard device.

12. The intake structure according to claim 4, wherein the intake passage extends from front to rear in a fore and aft direction.

13. The intake structure according to claim 1, wherein the opposing wall is a bottom wall of the intake passage member.

14. The intake structure according to claim 1, wherein the vehicle consists of a hybrid vehicle using an electric motor for propulsion, in addition to the internal combustion engine, and the onboard device comprises a PCU for the electric motor.

* * * * *